United States Patent
Dalleau

(10) Patent No.: US 11,552,116 B2
(45) Date of Patent: Jan. 10, 2023

(54) IMAGE SENSORS WITH MULTI-CHANNEL TYPE TRANSISTORS

(71) Applicant: STMicroelectronics (Crolles 2) SAS, Crolles (FR)

(72) Inventor: Thomas Dalleau, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 119 days.

(21) Appl. No.: 17/011,900

(22) Filed: Sep. 3, 2020

(65) Prior Publication Data

US 2021/0074749 A1    Mar. 11, 2021

(30) Foreign Application Priority Data

Sep. 9, 2019   (FR) ...................................... 1909888

(51) Int. Cl.
  *H04N 5/3745*   (2011.01)
  *H01L 27/146*   (2006.01)

(52) U.S. Cl.
  CPC .. *H01L 27/14612* (2013.01); *H01L 27/14689* (2013.01); *H04N 5/3745* (2013.01); *H01L 27/14603* (2013.01); *H01L 27/14636* (2013.01)

(58) Field of Classification Search
  CPC ......... H01L 27/14612; H01L 27/14689; H01L 27/14603; H01L 27/14636; H01L 27/1463; H01L 27/14643; H01L 27/14614; H04N 5/3745
  See application file for complete search history.

(56) References Cited

U.S. PATENT DOCUMENTS

| | | | |
|---|---|---|---|
| 2011/0267505 A1 | 11/2011 | Dierickx | |
| 2014/0231622 A1* | 8/2014 | Mao | H04N 5/3559 250/208.1 |
| 2014/0264682 A1* | 9/2014 | Chuang | H01L 21/768 438/455 |
| 2015/0372093 A1 | 12/2015 | Saggio et al. | |
| 2016/0150174 A1 | 5/2016 | Hynecek | |
| 2017/0295338 A1 | 10/2017 | Geurts | |
| 2019/0104273 A1* | 4/2019 | Sato | H04N 5/37455 |
| 2020/0091212 A1* | 3/2020 | Park | H01L 27/14603 |

FOREIGN PATENT DOCUMENTS

WO    2006/109937 A1    10/2006

OTHER PUBLICATIONS

Draghici et al., "A new SiC diode with significantly reduced threshold voltage," *Proceedings of the 29th International Symposium on Power Semiconductor Devices &ICs (ISPSD), Sapporo*, 2017, pp. 355-358.
Shannon, "Reducing the effective height of a Schottky barrier using lowenergy ion implantation," *Appl. Phys. Lett.*, vol. 24, 1974, pp. 369-371.

* cited by examiner

*Primary Examiner* — Padma Haliyur
(74) *Attorney, Agent, or Firm* — Seed Intellectual Property Law Group LLP

(57) ABSTRACT

A pixel includes a photodiode and first and second transistors, the first and second transistors being coupled in series. One of the first and second transistors is a P channel transistor and the other is an N channel transistor. An electronic device may include one or more of the pixels.

20 Claims, 13 Drawing Sheets

IMAGE SENSORS WITH MULTI-CHANNEL TYPE TRANSISTORS

BACKGROUND

Technical Field

The present disclosure relates generally to electronic circuits, and more specifically to electronic circuits, for example pixels, comprising photodiodes and transistors.

Description of the Related Art

An image sensor is a photosensitive electronic component used to convert electromagnetic radiation (UV, visible or IR) emitted by a scene into analog electric signals. These signals are next amplified, then digitized by one or several analog-digital converters and lastly processed in order to obtain a digital image.

The image sensor is made up of a plurality of pixels, each pixel generally comprising a photodiode and transistors. Each pixel supplies an analog signal for example corresponding to a pixel of the finished digital image.

BRIEF SUMMARY

One embodiment addresses all or some of the drawbacks of known pixels.

One embodiment provides a pixel comprising a photodiode and first and second transistors, the first and second transistors being coupled in series, one of the first and second transistors being a P channel transistor and the other being an N channel transistor.

According to one embodiment, the second transistor is coupled in parallel with a third transistor of the opposite channel type from the channel type of the second transistor.

According to one embodiment, the control signals of the second and third transistors are such that the second and third transistors are on at the same times.

According to one embodiment, the gate of the first transistor is coupled to one of the terminals of the photodiode by a fourth transistor.

According to one embodiment, the fourth transistor has the same channel type as the first transistor.

According to one embodiment, the gate of the first transistor is coupled to a node for applying a reference voltage by a fifth transistor.

According to one embodiment, the fifth transistor has the same channel type as the first transistor.

According to one embodiment, the first transistor is coupled between a node for applying a reference voltage and a central node, and the second transistor is coupled between the central node and an output node of the pixel.

According to one embodiment, the photodiode is at least partially surrounded by isolated conductive trenches.

According to one embodiment, certain isolated conductive trenches extend over at least part of the height of the transistors.

According to one embodiment, the pixel comprises a first stage comprising the photodiode and a second stage comprising the transistors, the first and second stages being attached to one another.

One embodiment provides an electronic device comprising at least one pixel as previously described.

Another embodiment provides a method for manufacturing a pixel as previously described, the method comprising a step for manufacturing a first stage comprising the photodiode, attaching a second stage and forming transistors in the second stage.

According to one embodiment, the method comprises forming cavities extending over the height of the transistors and at least partially over the height of the photodiode, at least some of the cavities being partially filled with conductive material and partially filled with insulating material.

According to one embodiment, some of the cavities are completely filled with conductive material.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
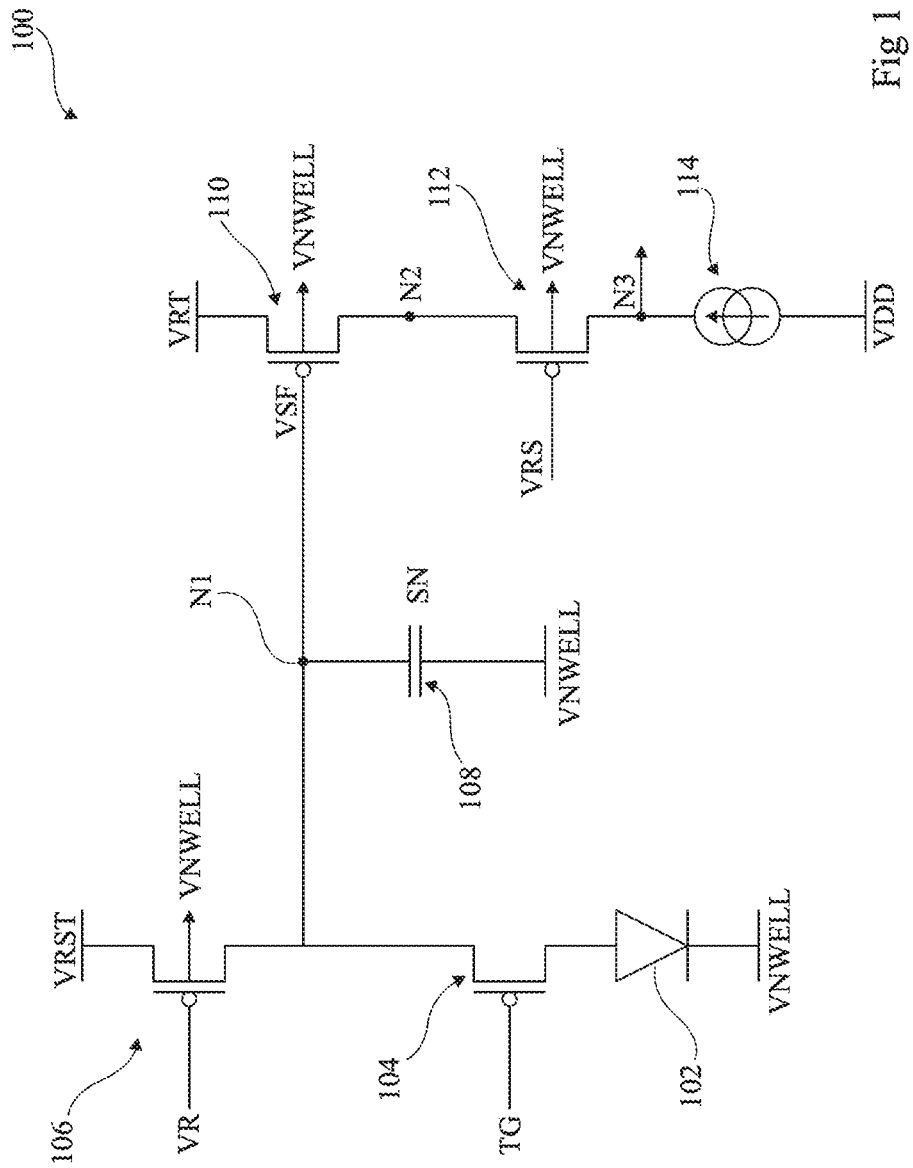
FIG. 1 shows an exemplary pixel comprising a photodiode and transistors.

FIG. 1 shows an exemplary circuit comprising a photodiode. More specifically, FIG. 1 shows an exemplary pixel 100 having a 4T structure, that is to say, a pixel comprising an electronic circuit with four transistors. It may for example be a pixel of an image sensor.

The pixel 100 comprises a photodiode 102. The photodiode 102 receives radiation from a scene and transforms it into electric charges. In the illustrated example, the charges in question are holes.

The photodiode 102 is coupled, preferably connected, by its cathode, to a node for applying a reference voltage, for example a voltage VNWELL. The anode of the photodiode 102 is coupled to a node N1 by means of the conduction terminals (source and drain) of a transfer transistor 104. The transistor 104 in this example is a P channel MOS transistor. The gate of the transistor 104 receives a control signal TG. The signal TG is for example a signal alternating between a high value, for example about 3.5 V, and a low value, for example about 0 V.

The transfer transistor 104 makes it possible to transfer the electronic charges generated by the photodiode 102 onto the node N1.

The node N1 is coupled to a node for applying a voltage VRST by means of a reset transistor 106 (transistor RESET). The transistor 106 in this example is a P channel MOS transistor. The gate of the transistor 106 receives a control signal VR. The signal VR is for example a signal able to switch between a high value, for example about 3.5 V, and a low value, for example about 0 V. Furthermore, the substrate of the transistor 106 can be biased by the voltage VNWELL. The voltage VNWELL is for example substantially equal to 2.5 V. The voltage VRST is, in this example, approximately equal to 0.5 V.

The reset transistor 106 makes it possible to reset the voltage VSF on the node N1 to a value V0. Thus, during the reset, the voltage VSF on the node N1 is equal to a value V0 that depends on the voltage VRST, for example greater than the voltage VRST.

The node N1 is also coupled to a node for applying a reference voltage, for example the voltage VNWELL, by means of a capacitor 108 SN.

The capacitor 108 for example makes it possible to store the electric charges coming from the photodiode 102.

The node N1 is also coupled, preferably connected, to the gate of a transistor 110 of the common drain type (Source Follower). The transistor 110 is coupled, preferably connected, in series with a read transistor 112, and for example a current source 114. The current source represents a reading row or column of a pixel matrix. More specifically, the transistor 110 is coupled by its drain and source terminals between a node for applying a reference voltage VRT and a node N2, the transistor 112 is coupled between the node N2 and a node N3. The current source 114 is for example coupled between the node N3 and a node for applying a reference voltage VDD. The transistors 110 and 112 in this example are P channel MOS transistors.

The transistor 112 receives a control voltage VRS on its gate. The signal VRS is for example a signal able to switch between a high value, for example about 3.5 V, and a low value, for example about 0 V. The substrates of the transistors 110 and 112 are for example biased by the voltage VNWELL.

The transistor 110 makes it possible to obtain, at the node N2, a voltage representative of the quantity of charges located on the node N1. More specifically, the voltage on the node N2 is substantially equal to the value of the voltage VSF multiplied by the gain of the transistor 110 plus an offset value Voffset. The value Voffset is the voltage measured at the node N2 when the voltage VSF is nil.

The transistor 112 makes it possible to read the representative voltage on the reading row or column. More specifically, the transistor 112 makes it possible to choose, among a matrix of pixels similar to the pixel 100, which pixel must be read.

The node N3 is thus an output node of the pixel 100. The output signal of the pixel is a representative value of the radiation received by the photodiode. The output signal is the value on the node N3 when the pixel is read.

In this example, all of the transistors of the pixel 100 are transistors having a same type of channel, for example P channel transistors.

Thus, during the operation of the pixel 100, the voltage VSF on the node N1 is reset to the value V0 depending on the voltage VRST. The transistor 104 is turned on. The charges generated by the photodiode 102 move toward the node N1 and cause the voltage VSF to vary from the value V0 to the reset. A voltage representative of the number of charges on the node N1 is thus obtained on the level of the node N2 and can be read by the image sensor at the output node N3, when the transistor 112 is on.

For optimal reading, the read transistor 112 preferably minimizes the leak to pass when the transistor 112 is off, but the transistor 112 preferably has a gain close to 1 when it is on, such that the voltage on the node N3 is substantially equal to the voltage on the node N2. The transistor 112 is strongly reversed and works in the linear zone.

Figure 2:
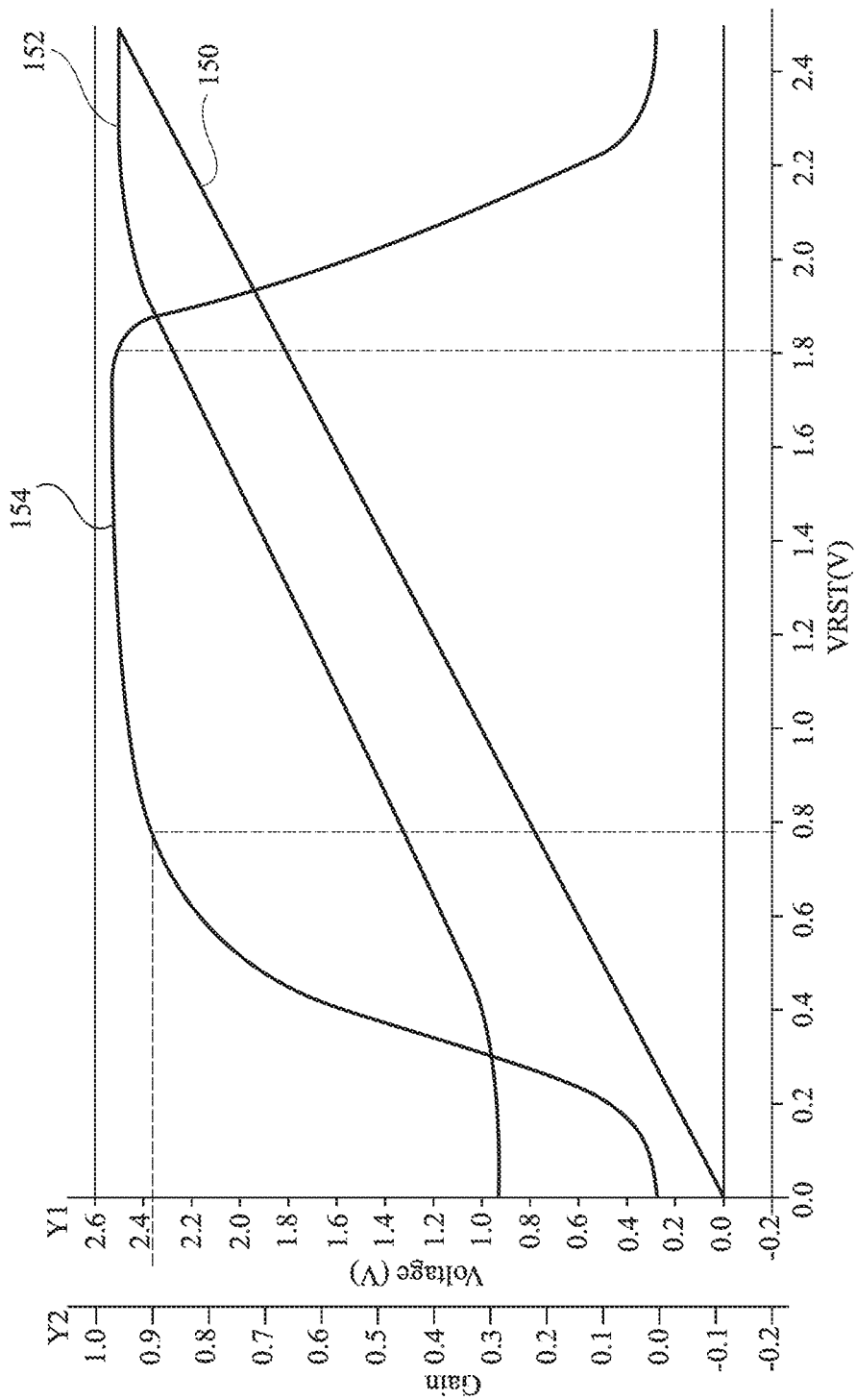
FIG. 2 shows characteristic variations of the pixel of FIG. 1.

FIG. 2 shows characteristic variations of the circuit of FIG. 1. The transistor 104 is considered to be in an ideal off state, that is to say, without leaks. More specifically, FIG. 2 shows, as a function of the value (in volts) of the voltage VRST:

the voltage VRST (curve 150);
the voltage on the node N3 (curve 152); and
the gain between the node N3 and the node for applying the voltage VRST, that is to say, the gain of the reading chain, for example in the case where the transistor 104 is off, preferably perfectly off (curve 154).

One can see that over a range of values of the voltage VRST, the curve 152 is substantially parallel to the curve 150. This value range is for example between about 0.8 V and about 1.8. Thus, for this value range, the gain is substantially constant and greater than 0.9, that is to say, close to 1. For a voltage VRST substantially equal to 0.5 V, as is for example the case in the example of FIG. 1, the gain is substantially equal to 0.75 V.

In order to obtain a gain close to the value 1, the reset voltage VRST should be part of this value range, and for example greater than the value 0.8.

In order to decrease the consumption of the pixel 100, one may wish to decrease the voltage VRST. It is therefore desirable for the range of values in which the gain is constant and high also to cover values of the lower voltage VRST, while keeping the same performance.

In other cases, one may wish to be able to function at lower values and higher values of the voltage VRST.

In order to shift the value range toward the lower values, that is to say, to modify the value range in which the gain of the transistor 112 is maximal, one could have decreased the value of the threshold voltage of the transistor 112. However, this would have caused an increase in the leaks of the transistor and therefore a decrease in the performance of the pixel.

Figure 3:
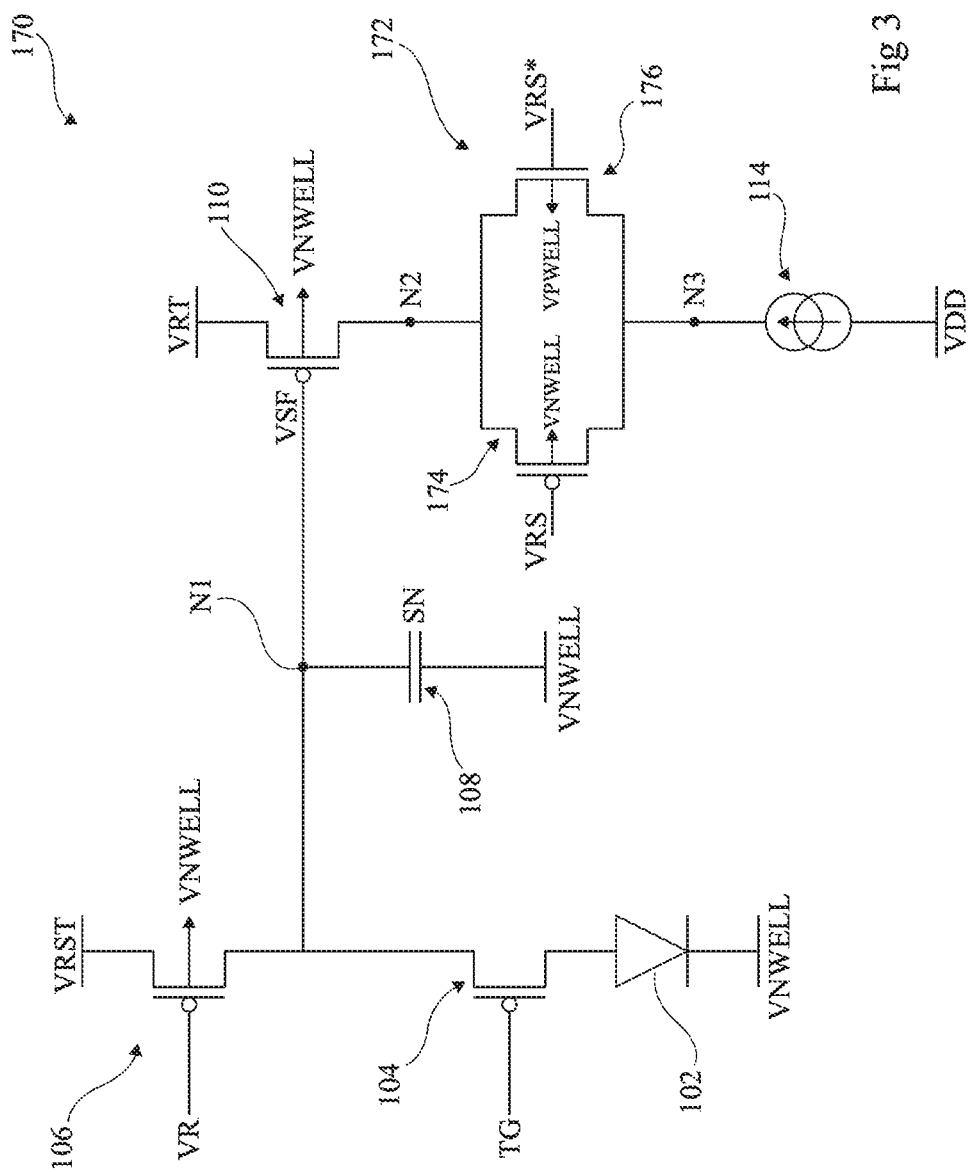
FIG. 3 shows an embodiment of a pixel comprising a photodiode and transistors.

FIG. 3 shows an embodiment of a circuit comprising a photodiode. More specifically, FIG. 3 shows a pixel 170. The pixel 170 is for example comprised in an electronic device, for example an image sensor. The electronic device for example comprises at least one pixel 170, preferably a matrix of pixels 170.

The pixel corresponds to the unit of an image, for example in a sensor. An image sensor comprises a plurality of substantially identical pixels each comprising the same components. Thus, the elements described in FIG. 3 are components of the described pixel and are reproduced in each pixel of an image sensor.

The pixel 170 comprises the elements of the pixel 100 of FIG. 1, referenced in the same way, with the exception of the transistor 112, which is replaced by an assembly 172. Like in the case of the pixel 100, the charges generated in the pixel 170 are holes.

In particular, the pixel 170 comprises the photodiode 102. The photodiode 102 receives, like in the example of FIG. 1, radiation from a scene and transforms it into electric charges.

The photodiode 102 is coupled, preferably connected, by its cathode, to a node for applying a reference voltage, for example the voltage VNWELL. The anode of the photodiode 102 is coupled to the node N1 by means of the conduction terminals (source and drain) of the transfer transistor 104. The transistor 104 in this example is a P channel MOS transistor. The gate of the transistor 104 receives the control signal TG previously described.

The transfer transistor 104 makes it possible to transfer the electronic charges generated by the photodiode 102 onto the node N1.

The node N1 is coupled to a node for applying a voltage VRST by means of the reset transistor 106. The transistor 106 in this example is a P channel MOS transistor. The gate of the transistor 106 receives a control signal VR, previously described. Additionally, the substrate of the transistor 106 can be biased by a voltage VNWELL, previously described.

The reset transistor 106 makes it possible to reset the voltage VSF on the node N1 to a value V0. Thus, during the reset, the voltage VSF on the node N1 is equal to a value V0 that depends on the voltage VRST, for example greater than the voltage VRST.

The node N1 is also coupled to a node for applying a reference voltage, for example the voltage VNWELL, by means of the capacitor 108 SN.

The capacitor 108 for example makes it possible to store the electric charges coming from the photodiode 102.

The node N1 is also coupled, preferably connected, to the gate of the transistor 110 of the common drain type (source follower). The transistor 110 is coupled, preferably connected, in series with the assembly 172, and for example a current source 114. The current source represents a reading row or column of a pixel matrix. More specifically, the transistor 110 is coupled by its drain and source terminals between a node for applying a reference voltage VRT and a node N2, the assembly 172 is coupled between the node N2 and a node N3. The current source 114 is for example coupled between the node N3 and a node for applying a reference voltage VDD. In this example, the transistor 110 is a P channel MOS transistor. The substrate of the transistor 110 is for example biased by the voltage VNWELL.

The transistor 110 makes it possible to obtain, at the node N2, a voltage representative of the quantity of charges located on the node N1. More specifically, the voltage on the node N2 is substantially equal to the value of the voltage VSF multiplied by the gain of the transistor 110 plus the offset value Voffset.

The assembly 172 makes it possible to read the representative voltage on the reading row or column. More specifically, the assembly 172 makes it possible to choose, among a matrix of pixels similar to the pixel 100, the pixel to be read.

The node N3 is thus an output node of the pixel 100. The output signal of the pixel is a representative value of the radiation received by the photodiode. The output signal is the value on the node N3 when the pixel is read.

The assembly 172 comprises two transistors, a transistor 174 and a transistor 176. The transistors 174 and 176 are coupled, preferably connected, in parallel by their sources and drains between the nodes N2 and N3. More specifically, in the example of FIG. 3, the source of the transistor 174 is connected to the drain of the transistor 176. Likewise, the drain of the transistor 174 is connected to the source of the transistor 176. The drain of the transistor 176 and the source of the transistor 174 are coupled, preferably connected, to the node N3. The source of the transistor 176 and the drain of the transistor 174 are coupled, preferably connected, to the node N2.

The transistor 174 in this example is a P channel MOS transistor. The gate of the transistor 174 receives the control signal VRS. The substrate of the transistor 174 is biased by the voltage VNWELL.

The transistor 176 is an N channel MOS transistor. The gate of the transistor 176 receives a control signal VRS*. The control signal VRS* is the signal opposite the signal VRS. When the control signal VRS is equal to a high value, the control signal VRS* is equal to a low value, and vice versa. For example, when the control signal VRS is equal to a non-nil and positive value, the control signal VRS* is nil, and when the signal VRS is nil, the signal VRS* is equal to a non-nil and positive value. The substrate of the transistor 176 is biased by a voltage VPWELL. The voltage VPWELL is for example approximately equal to 0.

For example, all of the transistors of the pixel 170 have the same channel type, for example P, with the exception of the transistor 176.

Preferably, the pixel 170 is an integrated circuit. The transistors 104, 106, 110, 174 and 176, as well as the photodiode 102 and the capacitor 108, are preferably formed in the integrated circuit.

The pixel 170 therefore comprises a so-called common drain transistor 110 (source follower) coupled, preferably connected, in series with a read transistor 176 with the opposite channel type relative to that of the so-called common drain transistor 110. The read and common drain transistors are coupled between a node for applying a reference voltage (VRT) and an output node (N3). In this example, the so-called common drain transistor 110 is a P-channel transistor and the read transistor 176 is an N channel transistor. The read transistor 176 is also in parallel with a read transistor 174 with the same channel type as the so-called common drain transistor, in this example the P channel transistor.

Figure 4:
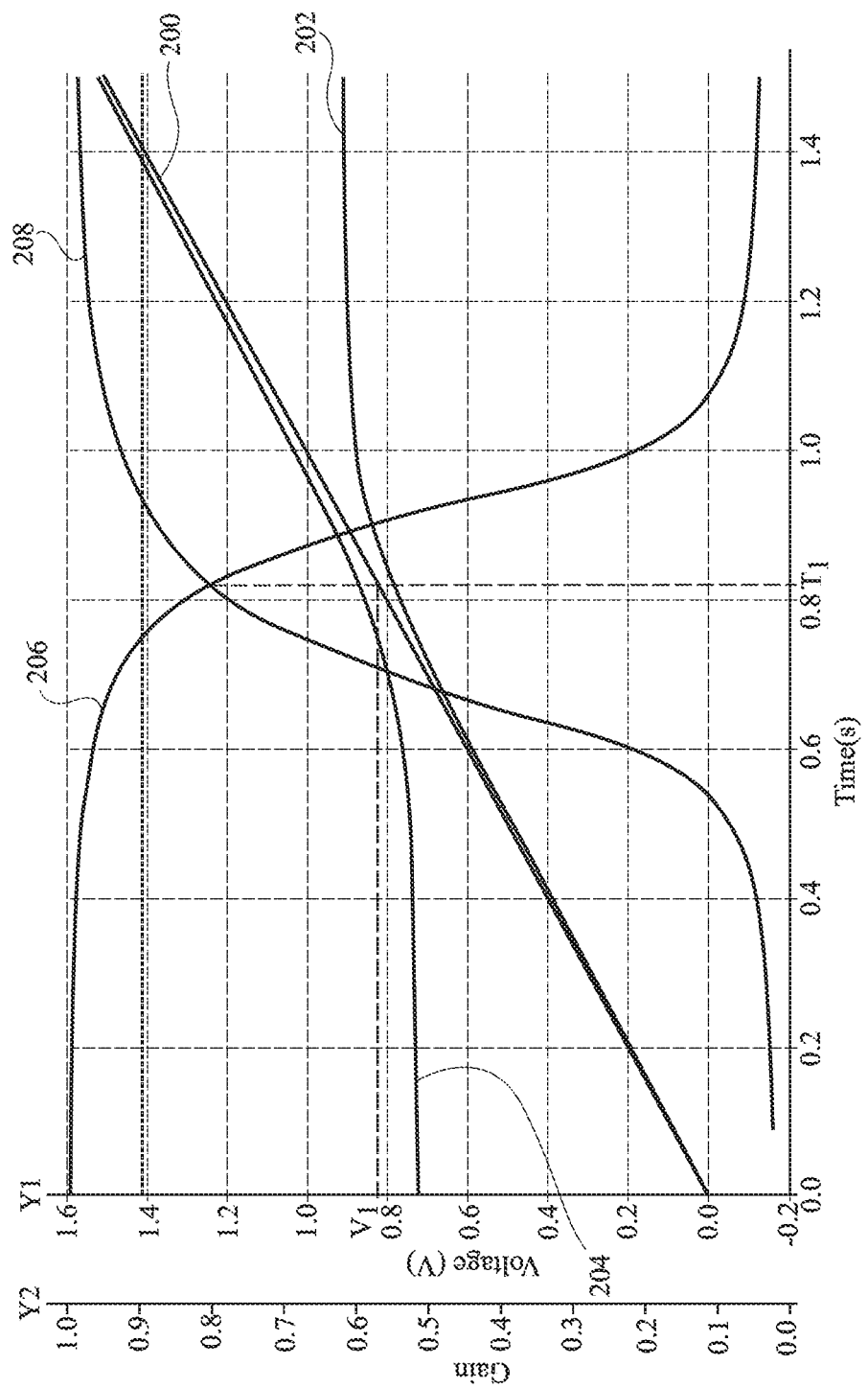
FIG. 4 shows characteristic variations of the pixel of FIG. 3.

FIG. 4 shows characteristic variations of part of the circuit of FIG. 3. In particular, FIG. 4 shows characteristic variations of the assembly 172. FIG. 4 shows, as a function of time (Time (s)):
- the voltage on the node N2 (curve 200), which corresponds to an input value and which has been deliberately made to vary linearly. Curve 200 is therefore an increasing line, with equation y=x;
- the voltage on the node N3 in the case where only the transistor 176 is on (curve 202), the transistor 174 then being off;
- the voltage on the node N3 in the case where only the transistor 174 is on (curve 204), the transistor 176 then being off;
- the gain of the assembly 172 between the node N2 and the node N3 in the case where only the transistor 176 is on (curve 206), the transistor 174 then being off; and
- the gain of the assembly 172 between the node N2 and the node N3 in the case where only the transistor 174 is on (curve 208), the transistor 176 then being off.

The variations of the curves 202, 204, 206 and 208 depend on the value of the input voltage, that is to say, the voltage on node N2 (curve 200).

In this example, it is considered that the transistors are perfect transistors.

In the case where only the transistor 176 is on, the curve 202 is substantially parallel, or even substantially equal, to the curve 200 during a first period, then moves away therefrom during a second period. The first period for example corresponds, over all of the values considered in FIG. 4, to the period preceding a moment T1, and the second period corresponds, over all of the considered values, to the period following the moment T1. In this example, the moment T1 is substantially equal to 0.82 s, which corresponds to a value V1 of the voltage on the node N2, substantially equal to 0.82 V. As a result, the gain, shown by the curve 206, is high during the first period, then decreases during the second period. During the first period, the gain is greater than 0.8, or even greater than 0.9, and is therefore close to 1.

In the case where only the transistor 174 is on, during the first period, the curve 204 is distant from the curve 200 and comes closer thereto. During the second period, the curve 204 is substantially parallel to the curve 200 and is close thereto. Thus, the gain, shown by the curve 208, is small during the first part and increases until becoming, in the second part, greater than 0.8, or even 0.9, and therefore close to 1.

One can see that the curves 206 and 208 intersect at the moment T1, corresponding to the value V1 of the voltage on the node N2. At this moment T1, the gains are both approximately equal to 0.8. Thus, before the moment T1, that is to say, for values of the voltage on the node N2 less than V1, the gain of the assembly 172 is higher by going through the transistor 176. After the moment T1, that is to say, for values of the voltage on the node N2 greater than V1, the gain of the assembly 172 is higher by going through the transistor 174.

During an operating step of the pixel 170, and more particularly during the reading of the pixel 170, the assembly 172 is on, that is to say, the transistors 174 and 176 are both on. The control voltages VRS and VRS* being opposite one another, the two transistors become on substantially at the same time.

The current coming from the node N2 and passing through the assembly 172 passes through the transistor 174 or 176 having the highest gain. Thus, when the voltage on the node N2 is less than V1, the current passes through the transistor 176, and when the voltage on the node N2 is greater than V1, the current passes through the transistor 174.

The gain of the assembly 172 is therefore always equal to the maximum of the gains of the transistors 174 and 176. In the example of FIG. 4, the gain of the assembly 172 is always greater than 0.8, mostly greater than 0.9, over the range of values of the voltage on the node N2 considered in FIG. 4. The value range in which the gain is close to 1 is wider than the value range described in relation with FIGS. 1 and 2, in which the assembly 172 is related by the transistor 112.

Figure 5:
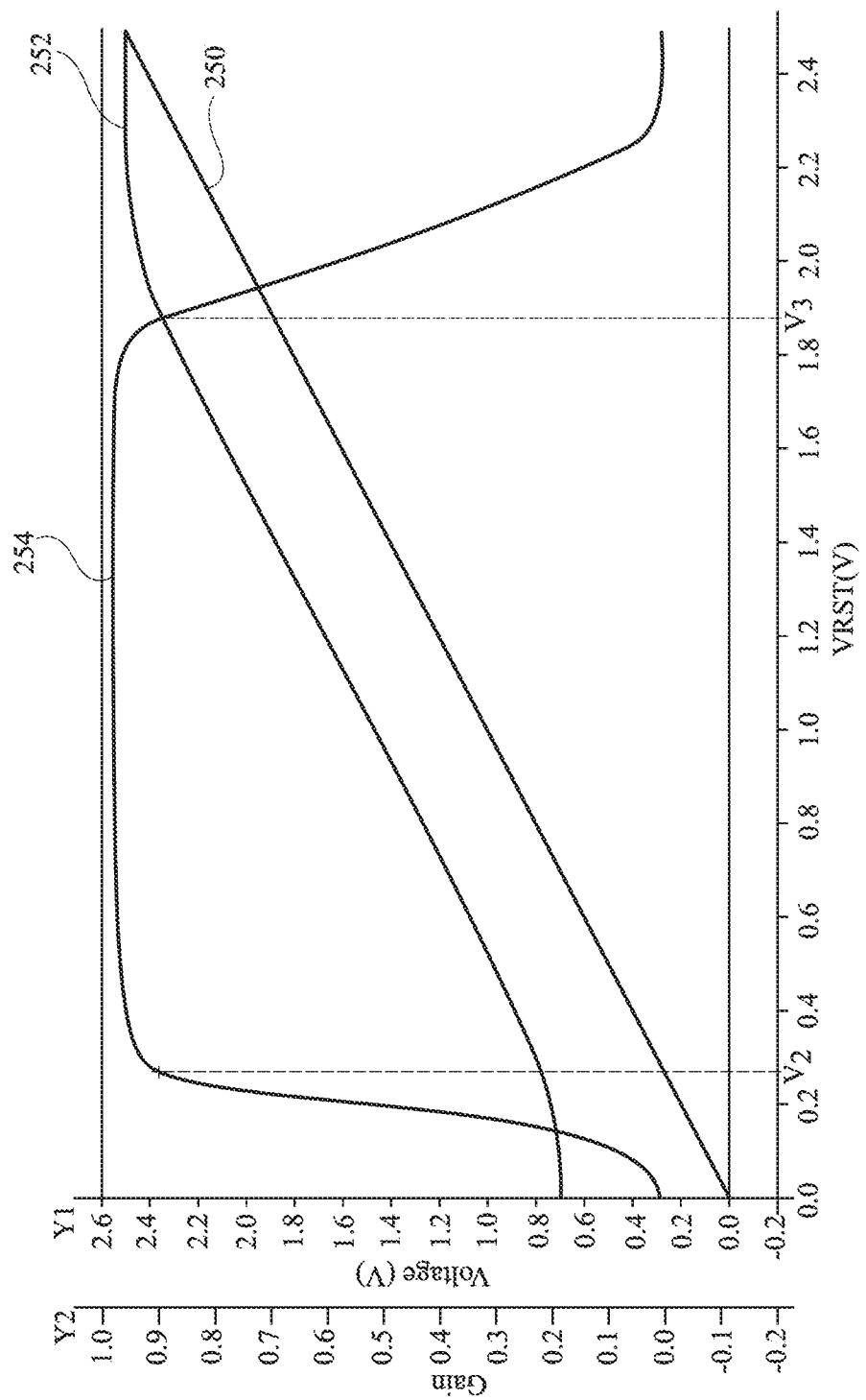
FIG. 5 shows characteristic variations of another part of the pixel of FIG. 3.

FIG. 5 shows characteristic variations of another part of the circuit of FIG. 3. In particular, FIG. 5 shows characteristic variations of the pixel 170, the transistor 104 being considered in an ideal off state, that is to say, without leaks.

FIG. 5 shows, as a function of the value (in volts) of the voltage VRST:
- the voltage VRST (curve 250);
- the voltage on the node N3 (curve 252); and
- the gain between the node N3 and the node for applying the voltage VRST (curve 254).

FIG. 5 therefore comprises, for the embodiment of FIG. 3, curves showing the same elements as the curves of FIG. 2 for the example of FIG. 1.

The node N3 is still considered to be the output of the system and the value of the voltage on the node for applying the voltage VRST is the input of the system.

Like in FIG. 2, the curve representing the voltage on the node N3, here the curve 252, comprises a substantially linear part, substantially parallel to the curve 250 showing the input voltage, here the voltage VRST. This linear part corresponds to a range of values of the voltage VRST in which the gain is substantially constant at a value greater than 0.9.

The value range in question extends, in the example of FIG. 5, between a voltage V2 equal to about 0.25 V and a voltage V3 equal to about 1.8 V. In FIG. 2, this value range extends approximately between 0.8 V and 1.8 V. The value range making it possible to obtain a high gain has therefore been expanded, in particular toward the low voltage values VRST.

In the embodiment of FIG. 3, it is thus possible to choose the reset voltage VRST in a wider value range while retaining a high gain.

One advantage of the embodiment of FIG. 3 is that it is possible to broaden the value range while adding only one component.

Figure 6:
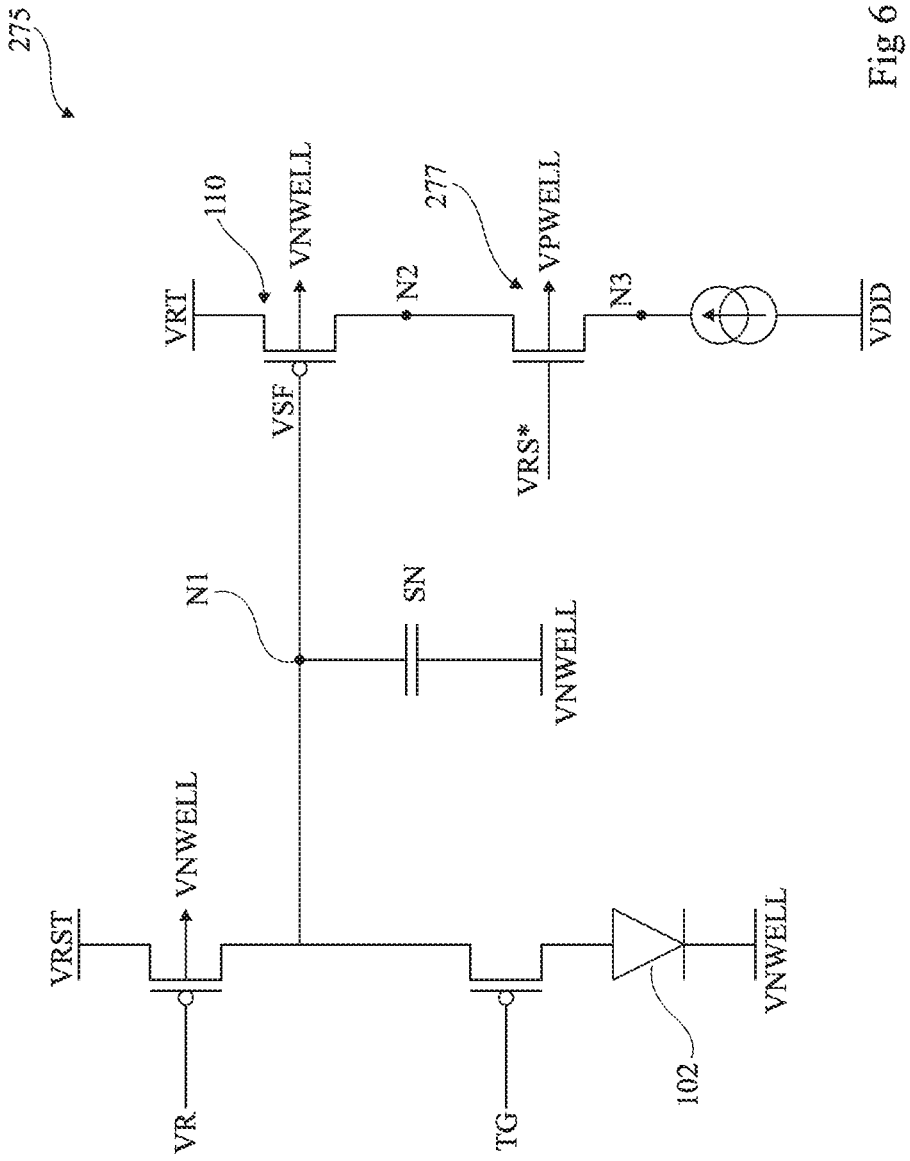
FIG. 6 shows another embodiment of a pixel comprising a photodiode and transistors.

FIG. 6 shows another embodiment of a circuit comprising a photodiode. In particular, FIG. 6 shows a pixel 275, comprising the elements of the pixel 170, with the exception of the assembly 172, which, in this embodiment, is replaced by a single transistor 277. Like in the case of the pixel 170, the charges generated in the pixel 275 are holes.

The pixel 275 is for example comprised in an electronic device, for example an image sensor. The electronic device for example comprises at least one pixel 275, preferably a matrix of pixels 275.

The pixel corresponds to the unit of an image, for example in a sensor. An image sensor comprises a plurality of substantially identical pixels each comprising the same components. Thus, the elements described in FIG. 6 are components of the described pixel and are reproduced in each pixel of an image sensor.

The transistor 277 is coupled, preferably connected, between the nodes N2 and N3 by its sources and drain. The transistor 277 in this example is an N channel MOS transistor. The gate of the transistor 277 receives the control signal VRS* previously defined. The substrate of the transistor 277 is biased by the voltage VPWELL.

For example, all of the transistors of the pixel 275 have the same channel type, for example P, with the exception of the transistor 277.

The pixel 275 therefore comprises a so-called common drain transistor 110 coupled in series with a read transistor 227 with the opposite channel type relative to that of the so-called common drain transistor, between a node for applying a reference voltage (VRT) and an output node (N3). In this example, the so-called common drain transistor 110 is a P-channel transistor and the read transistor 277 is an N channel transistor. In this embodiment, the transistor 277 is not in parallel with a transistor with the opposite channel type (in this case, the P channel).

Figure 7:
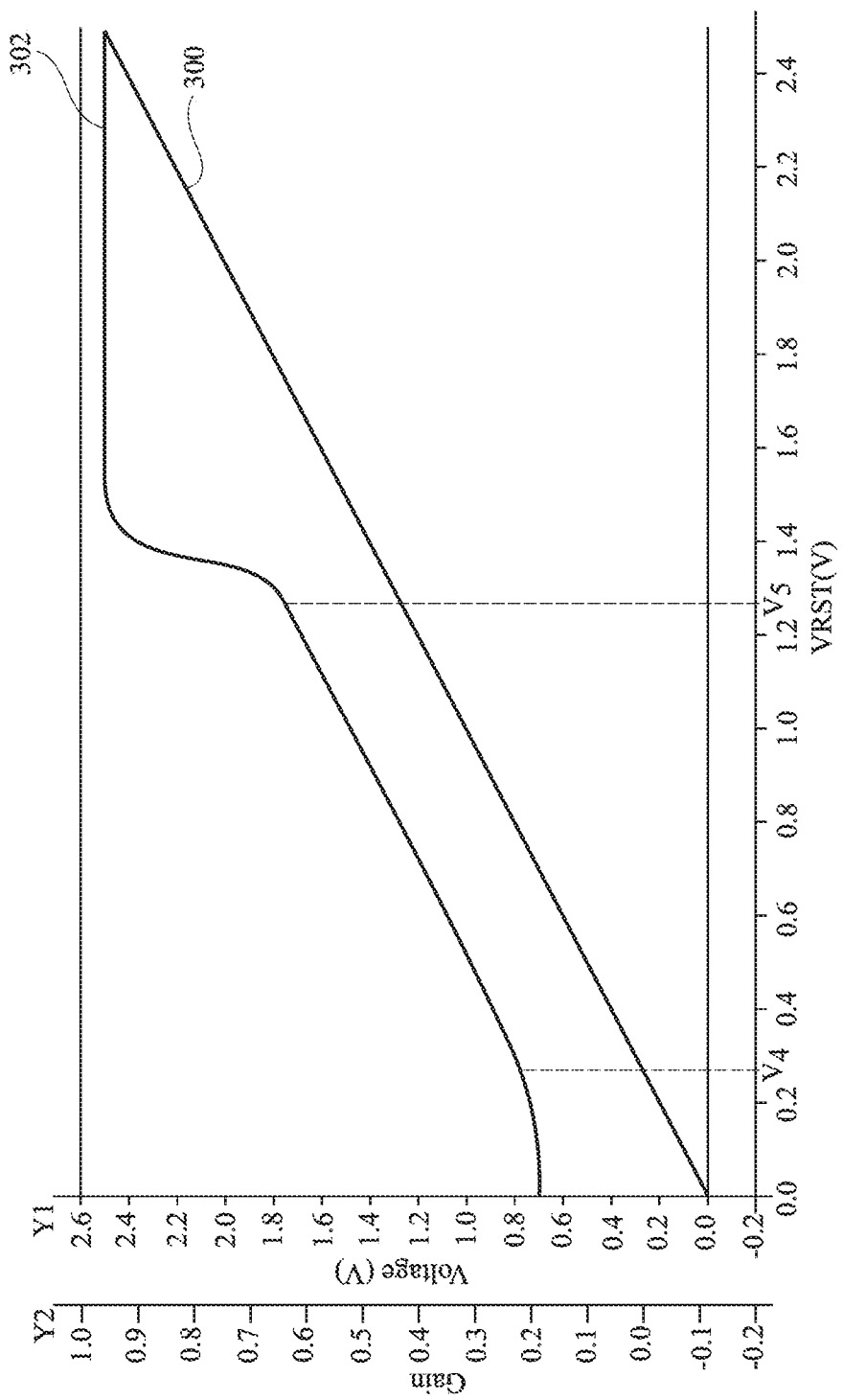
FIG. 7 shows characteristic variations of the pixel of FIG. 6.

FIG. 7 shows characteristic variations of the circuit of FIG. 6. In particular, FIG. 7 shows characteristic variations of the pixel 275, the transistor 104 being considered in an ideal off state, that is to say, without leaks.

FIG. 7 shows, as a function of the value (in volts) of the voltage VRST:

the voltage VRST (curve 300); and
the voltage on the node N3 (curve 302).

FIG. 7 therefore comprises, for the embodiment of FIG. 6, curves showing the same elements as the curves of FIG. 2 for the example of FIG. 1 and, for the embodiment of FIG. 3, of FIG. 5.

One can see that over a range of values of the voltage VRST, the curve 302 is substantially parallel to the curve 300. This value range is for example between a voltage V4 equal to about 0.3 V and a voltage V5 equal to about 1.25 V. Thus, for this value range, the gain, not shown, is substantially constant and greater than 0.8, mostly and greater than 0.9, that is to say, close to 1.

Outside this value range, the curve 302 moves away from the curve 300. The gain is therefore smaller than the gain in the value range, for example less than 0.8.

The range of values in the case of the embodiment of FIG. 6 is narrower than in the case of the embodiment of FIG. 3, but includes values lower than that of the value range of the example of FIG. 1. The embodiment of FIG. 6 therefore makes it possible to reset the node N1 to a value below 0.8 V while keeping a gain greater than 0.8, unlike the example of FIG. 1.

FIGS. 8 to 12 show embodiments of pixels. In these embodiments, the pixels are integrated circuits and comprise at least one P channel transistor and one N channel transistor.

Figure 8:
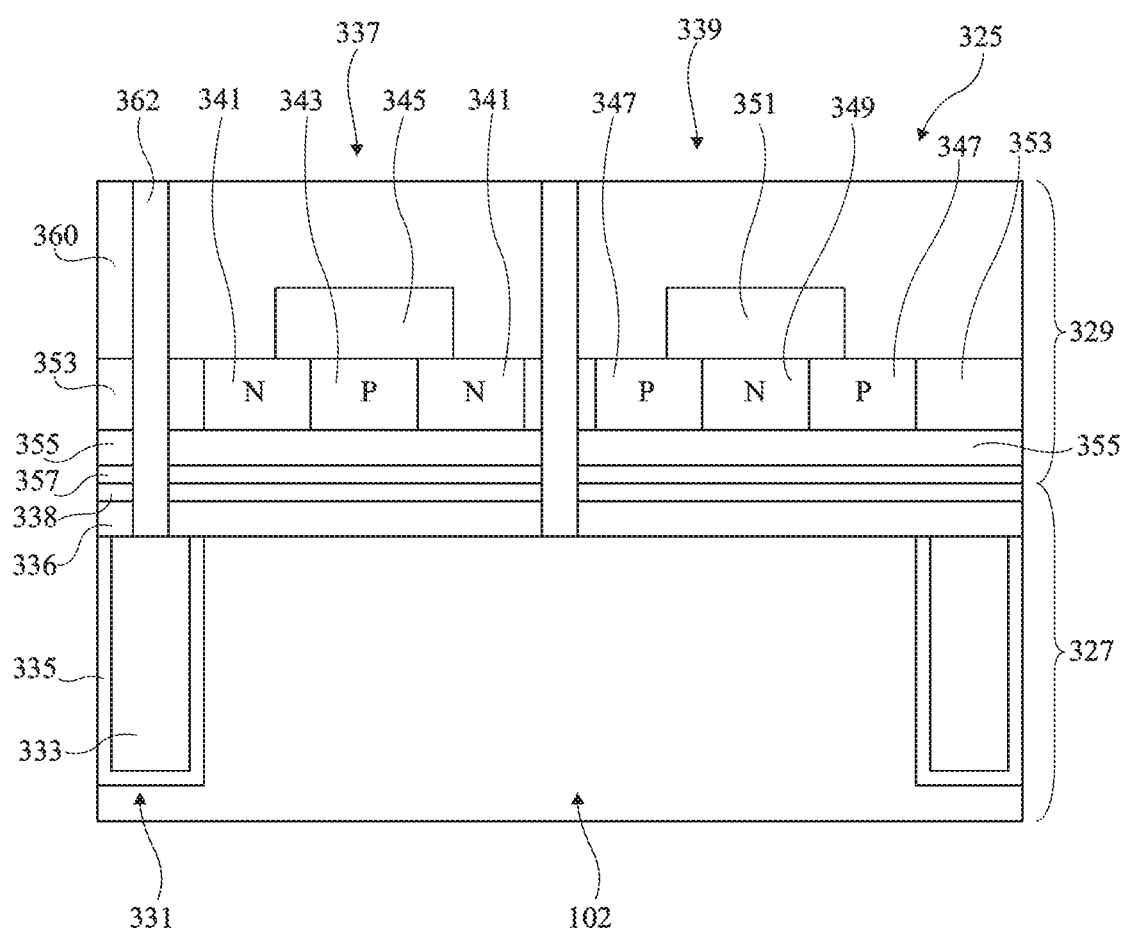
FIG. 8 is a schematic cross-sectional view of an example of part of the pixel of FIG. 3 or FIG. 6.

FIG. 8 is a schematic cross-sectional view of an example of part of the pixel 325 of FIG. 3 or FIG. 6.

The pixel 325 comprises two stages: a first stage 327 and a second stage 329 above the first stage 327.

The first stage 327 comprises a photodiode 102. The photodiode is for example formed in a P-doped substrate. The photodiode 102 is at least partially surrounded by isolated conductive trenches 331.

The trenches 331 comprise a conductive core 333 and an insulating sheath 335. The conductive core 333 is for example made from polycrystalline silicon and the insulating sheath is for example made from silicon oxide. The insulating sheath covers the partitions and the lower face of the conductive core. The sheath preferably also covers at least part of the upper face.

When the pixel 325 is operating, the conductive core 333 is for example biased so as to form an electromagnetic field. The electromagnetic field for example makes it possible to control the path of the charges generated by the photodiode 102. The polarization of the trenches 331 is also suitable for the operation of one type of transistors. This polarization could disrupt the operation of the transistors of the other type. In this example, the polarization of the trenches 331 is also suitable for the operation of the P channel transistors. It is therefore useful to separate the N channel transistors from the trenches 331 so as to ensure an optimal operation of the N channel transistors.

The substrate comprising the photodiode 102 and the trenches 331 is covered by an insulating layer 336. The insulating layer 336 extends at least above the photodiodes and trenches 331.

The layer 336 is covered by an attachment layer 338. Preferably, the attachment layer 338 is an insulating layer.

The second stage, covering the first stage 329, comprises the transistors of the pixel 325. This for example involves the transistors 104, 106, 110, 174, 176 or 277.

In the example of FIG. 8, two MOS transistors are shown: an N channel transistor 337 and a P channel transistor 339.

Preferably, all of the transistors of the pixel are located in the second stage. There is preferably no transistor, preferably no electronic component other than the photodiodes, in the first stage.

The N channel transistor 337 is represented by N wells 341 forming the source and drain of the transistor 337. The wells 341 are separated by a P well 343. The gate 345 of the transistor 337 is shown by a block located on the upper face of the wells 341 and 343.

The P channel transistor 339 is represented by P wells 347 forming the source and drain of the transistor 339. The wells 347 are separated by an N well 349. The gate 351 of the transistor 339 is shown by a block located on the upper face of the wells 347 and 349.

The transistors 337 and 339 are separated from one another, and optionally from other components located in the second stage 329, by insulating walls 353. The insulating walls are for example made from silicon oxide. The insulating walls 353 preferably extend over the height of the wells 341, 347. Preferably, the insulating walls 353 only extend in the second stage 329 and therefore not in the first stage 327.

The transistors 337 and 339 as well as the insulating walls 353 rest on an insulating layer 355. The face of the insulating layer 355 opposite the transistors is covered by an attachment layer 357. The attachment layer is preferably an insulating layer. All of the transistors of the second stage are therefore separated from the first stage by the insulating layer 355 and the attachment layer 357.

The attachment layers 338 and 357 are attached to one another. The attachment layers are for example layers of glue. The first and second stages 327 and 329 are for example attached to one another by the attachment layers 338 and 357.

The second stage also comprises an insulating layer 360 in particular covering the transistors and the insulating walls 353.

Conductive vias 362 reach the substrate of the first stage 327. The vias 362 pass through the insulating layers 336 and 355, the attachment layers 338 and 357, the insulating walls 353 and, at least partially, the insulating layer 360. The conductive vias 362 thus for example reach the conductive cores of the trenches 331 and the photodiode 102.

FIGS. 9A to 11B show steps of a manufacturing method of the embodiment of FIG. 8.

Figure 9A:
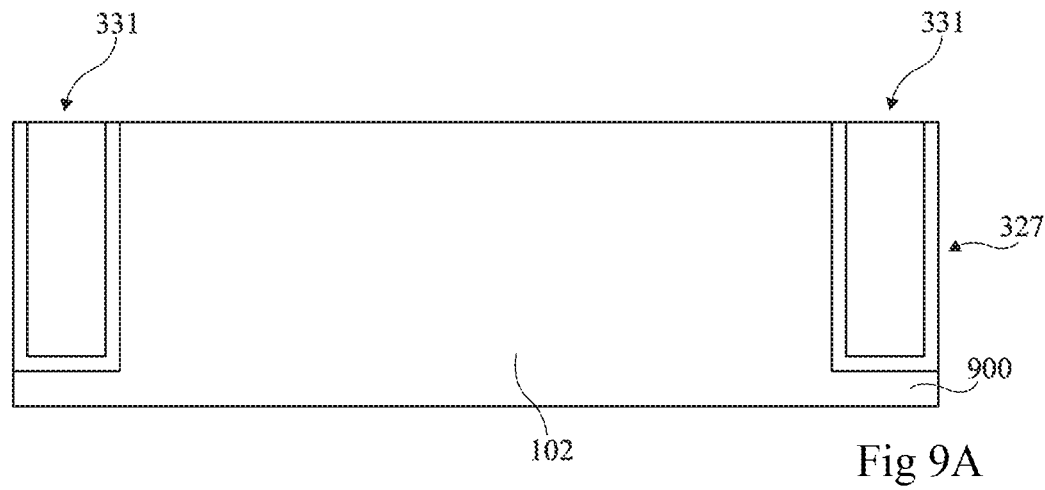
FIGS. 9A-C show steps of an exemplary a method for manufacturing the embodiment of FIG. 8.
Figure 9B:
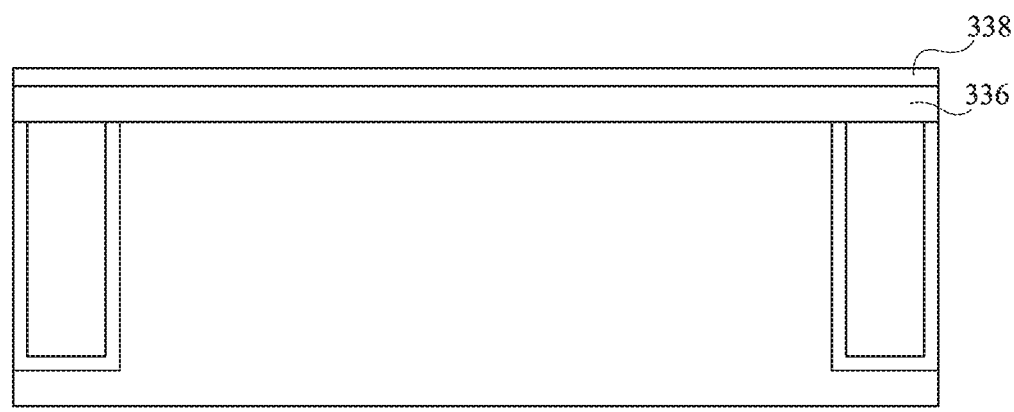
Figure 9C:
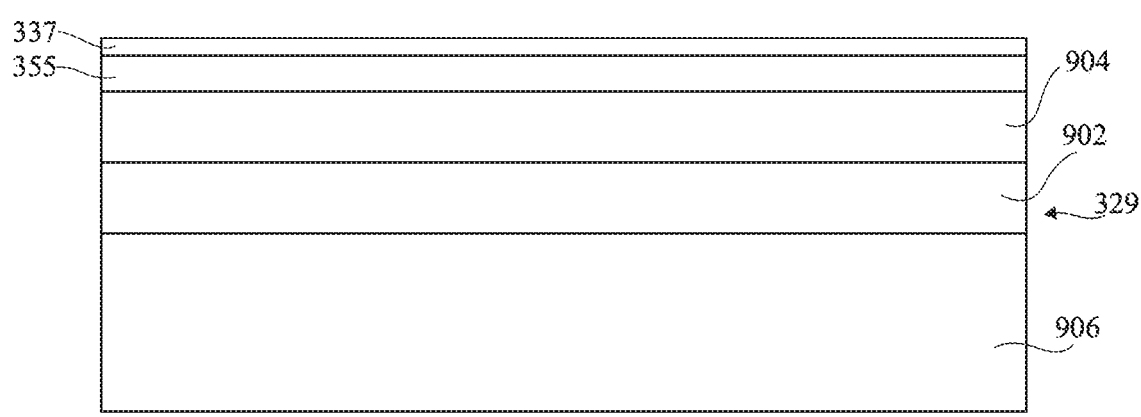

FIGS. 9A-9C show steps of an exemplary a method for manufacturing the embodiment of FIG. 8.

During the step of FIG. 9A, the first stage 327 is partially formed. The photodiode 102 and the isolated conductive trenches 331 are formed in a semiconductor substrate 900, for example a silicon substrate. Optionally, other components not shown can be formed in the first stage. Preferably, the first stage only comprises photodiodes, for example arranged in matrix form, and isolated conductive trenches.

During the step of FIG. 9B, the insulating layer 336 and the attachment layer 338 of the first stage 327 are formed on the substrate 900.

During the step of FIG. 9C, the second stage is partially formed. In this step, the second stage 329 comprises a semiconductor substrate. In the example of FIGS. 9A-11B, the substrate of the second stage is of the SOI (Semiconductor On Insulator) type, and therefore comprises an insulating layer 902 located between the layers 904 and 906 of semiconductor material. The layer 904 therefore covers the layer 902, which covers the layer 906.

The layer 904 is for example the layer in which the transistors will be formed. The thickness of the layer 904 is therefore sufficient to contain the wells of the transistors.

Additionally, the insulating layer 355 and the attachment layer 357 of the second stage 329 are formed on the substrate. More specifically, the layer 355 is formed on the layer 904 and the layer 357 is formed on the layer 355.

The first and second stages are therefore formed separately.

Figure 10A:
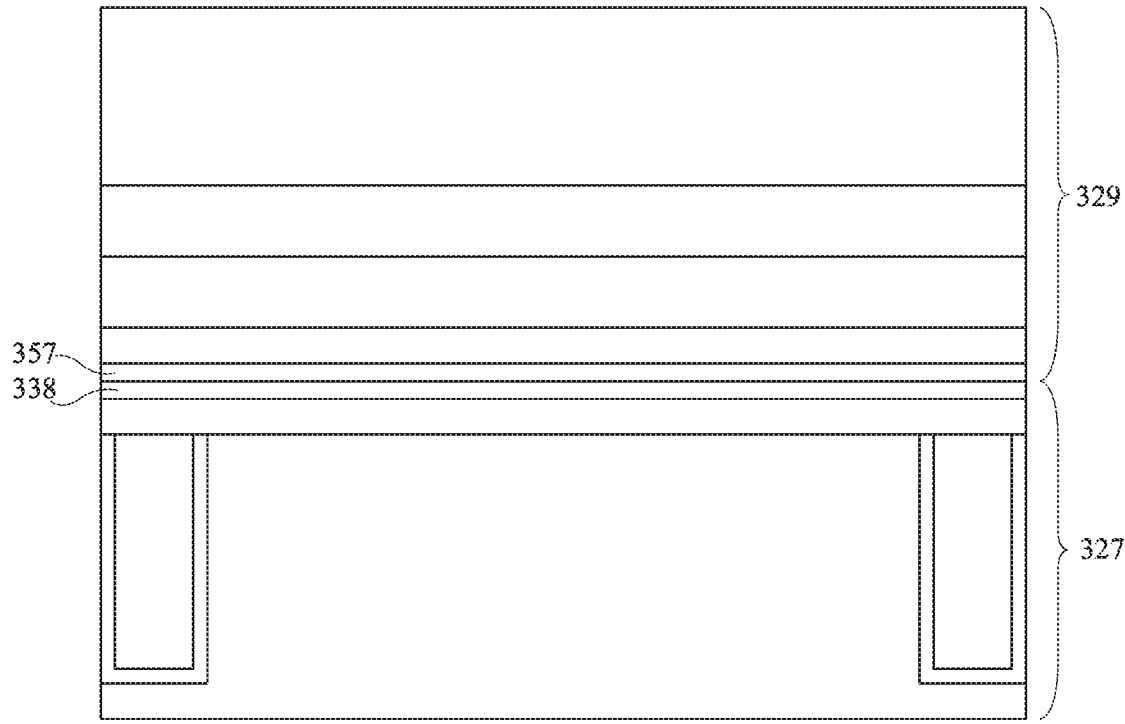
FIGS. 10A-B show other steps of an exemplary manufacturing method of the embodiment of FIG. 8.
Figure 10B:
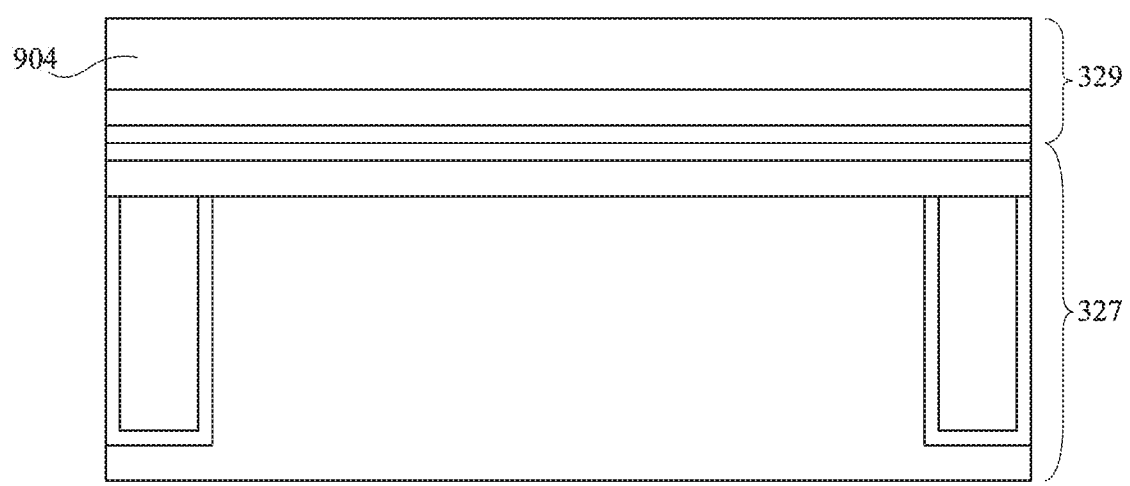

FIGS. 10A-B show other steps of an exemplary manufacturing method of the embodiment of FIG. 8.

During the step of FIG. 10A, the first and second stages are placed in contact. More specifically, the first and second stages are attached to one another by the attachment layers 357 and 338. To that end, the attachment layers 357 and 338 are placed in contact.

During the step of FIG. 10B, the substrate of the second stage is thinned. In the example of FIGS. 9A to 11B, the layers 902 and 906 are removed, and the layer 904 is still present. The layer 904 is used as etching stop layer during the thinning.

As a variant, the substrate of the second stage may be a solid substrate rather than the SOI type. The solid substrate is then thinned until reaching a sufficient thickness to contain the wells of the transistors.

Figure 11A:
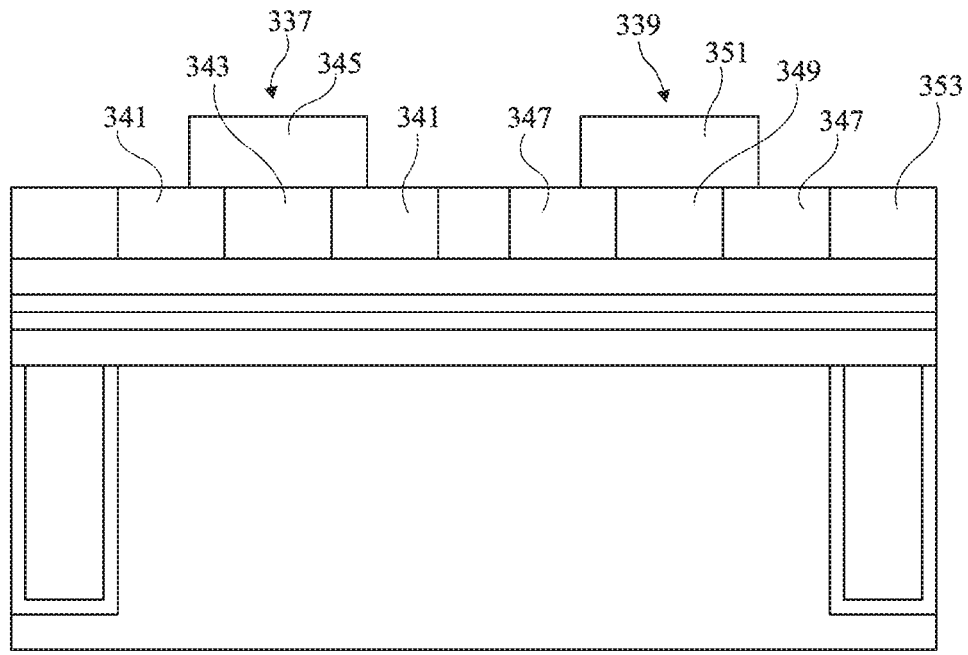
FIGS. 11A-B shows other steps of an exemplary manufacturing method of the embodiment of FIG. 8.
Figure 11B:
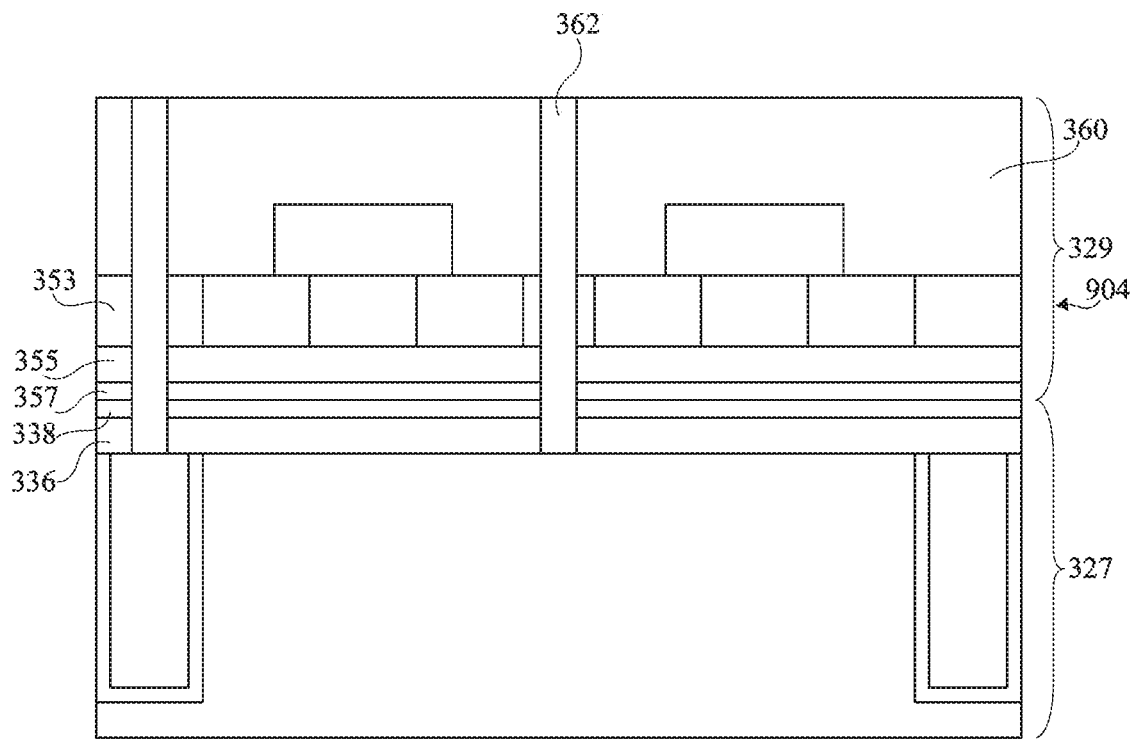

FIGS. 11A-11B show other steps of an exemplary manufacturing method of the embodiment of FIG. 8.

During the step of FIG. 11A, the transistors 337 and 339 are formed in the layer 904. The transistors 337 and 339 are also separated by the insulating walls 353. Optionally, other components not shown can be formed in the second stage.

In particular, the formation of the transistors comprises forming doped wells 341, 343, 347 and 349 and forming gates 345 and 351.

Based on the constraints regarding thermal budgets on the first stage, the formation of the transistors can for example be done at low enough temperatures, for example below about 700° C., not to disrupt the operation of the photodiodes.

During the step of FIG. 11B, the insulating layer 360 of the second stage is formed on the transistors and on the layer 904.

The conductive vias 362 are next formed through the insulating layers 336 and 355, the attachment layers 338 and 357, insulating walls 353 and, at least partially, the insulating layer 360. The vias 362 are conductive vias each comprising a conductive core. Preferably, the vias are insulated conductive vias. Preferably, the vias comprise an insulating sheath surrounding the side partitions of the insulating cores. The vias 362 make it possible to electrically connect the two stages. For example, vias 362 are formed through the second stage so as to reach the upper faces of the isolated conductive trenches.

Figure 12:
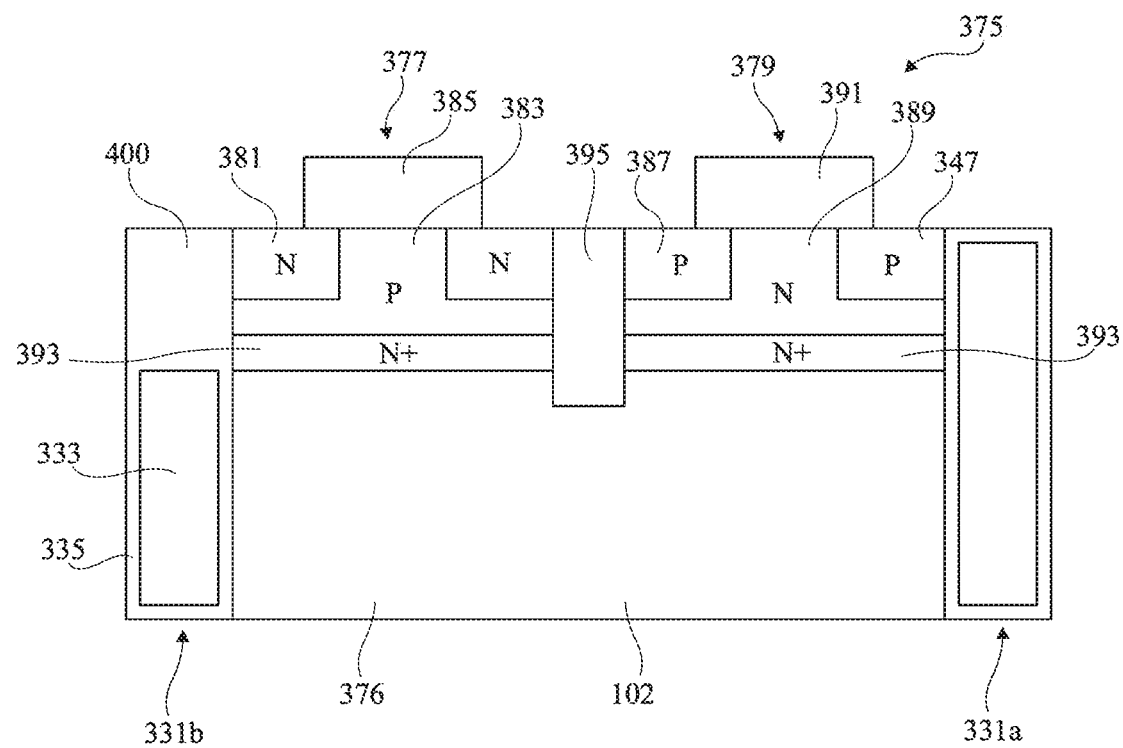
FIG. 12 is a schematic cross-sectional view of another example of part of the pixel of FIG. 3 or FIG. 6.

FIG. 12 is a schematic cross-sectional view of another example of part of the pixel 375 like that of FIG. 3 or FIG. 6.

The pixel 375 comprises a photodiode 102. The photodiode is for example formed in a P-doped region 376 of the substrate. The photodiode 102 is at least partially surrounded by isolated conductive trenches 331.

The trenches 331 comprise a conductive core 333 and an insulating sheath 335. The insulating sheath covers the side partitions and the lower face of the conductive core. The sheath preferably covers at least part of the upper face of the conductive core. The conductive core 333 is for example made from polycrystalline silicon and the insulating sheath is for example made from silicon oxide.

Transistors are located above the photodiode. This preferably involves transistors 104, 106, 110, 174, 176 or 277. Two transistors are shown: an N channel transistor 377 and a P channel transistor 379.

The N channel transistor 377 is represented by N wells 381 forming the source and drain of the transistor 377. The wells 381 are located in, and separated by, a P well 383. The gate 385 of the transistor 377 is shown by a block located on the upper face of the wells 381 and 383.

The P channel transistor 379 is represented by P wells 387 forming the source and drain of the transistor 379. The wells 387 are located in, and separated by, an N well 389. The gate 391 of the transistor 379 is shown by a block located on the upper face of the wells 387 and 389.

The wells 383 and 389 of the transistors 377 and 379 are separated from the P-doped region of the substrate in which the photodiode 102 is located by an N-doped (N+) semiconductor layer 393, for example having a dopant concentration greater than that of the wells 381 and 389.

Some of the transistors, for example the transistors 377 and 379, are separated from one another by insulating walls 395, for example made from silicon oxide. The insulating walls 395 preferably extend over the entire height of the transistors. The insulating walls 395 for example extend from the upper face of the wells 381 or 387 to the upper face of the photodiode 102. Optionally, the walls 395 extend in the photodiode 102.

When the pixel 375 is operating, the conductive core 333 is for example biased so as to form an electromagnetic field. The electromagnetic field for example makes it possible to control the path of the charges generated by the photodiode 102.

The polarization of the trenches 331 is also suitable for the operation of one type of transistors. This polarization could disrupt the operation of the transistors of the other type. In this example, the polarization of the trenches 331 is suitable for the operation of the P channel transistors. It is therefore useful to separate the N channel transistors from the trenches 331 so as to ensure an optimal operation of the N channel transistors.

Some trenches 331a extend up to the upper face of the wells 389. The trenches 331a are not adjacent to the transistors for which the polarization of the trenches is not appropriate. More specifically, the trenches 331a are not used to isolate the transistors for which the polarization of the trenches is not appropriate from the adjacent transistors.

Certain other trenches 331b only extend to the upper face of the substrate 102. Insulating walls 400 are located on the trenches 331b. The insulating walls 400 preferably extend from the trench 331b to the upper face of the wells 381 or 387. The walls 400 preferably extend over the entire height of the transistors.

The walls 400 covering the trenches 331b for example separate certain transistors for which the polarization of the trenches is not appropriate from adjacent transistors.

As a variant, the trenches 331a can all be replaced by trenches 331b. Thus, the trenches 331 of the pixel all extend in the region of the substrate in which the photodiode 102 is formed, but none of the trenches 331 extend over the height of the transistors.

An exemplary manufacturing method of the embodiment of FIG. 9 is described below.

During this method, the photodiode and the transistors are formed in a substrate, the transistors covering the region 376 in which the photodiode is formed. This comprises forming doped regions of the photodiode, doped wells 381, 383, 387 and 389 and gates.

The insulating walls 395 are formed between certain transistors.

Cavities are formed in the locations of the trenches 331. The cavities extend in the substrate from the upper face of the substrate, for example from the upper face of the wells. The cavities extend over at least part of the height of the substrate, including over the entire height of the transistors and preferably over the entire height of the photodiode.

A layer of insulating material is formed on the partitions and the bottom of the cavities so as to form the insulating sheath 335.

The cavities are next filled with conductive material. The cavities are preferably filled until reaching the level of the upper face of the wells 381, 383, 387 and 389.

The conductive material is next removed in the upper parts of the cavities in which the trenches 331b are formed. The conductive material is for example removed in these cavities up to the level of the upper face of the region 376.

The structure examples of FIGS. 8 and 9 make it possible to ensure that the polarization of the isolated conductive trenches, which is generally configured for structures only comprising one type of transistors (with N channel or P channel), has no negative impact on the transistors of the other type.

Figure 13:
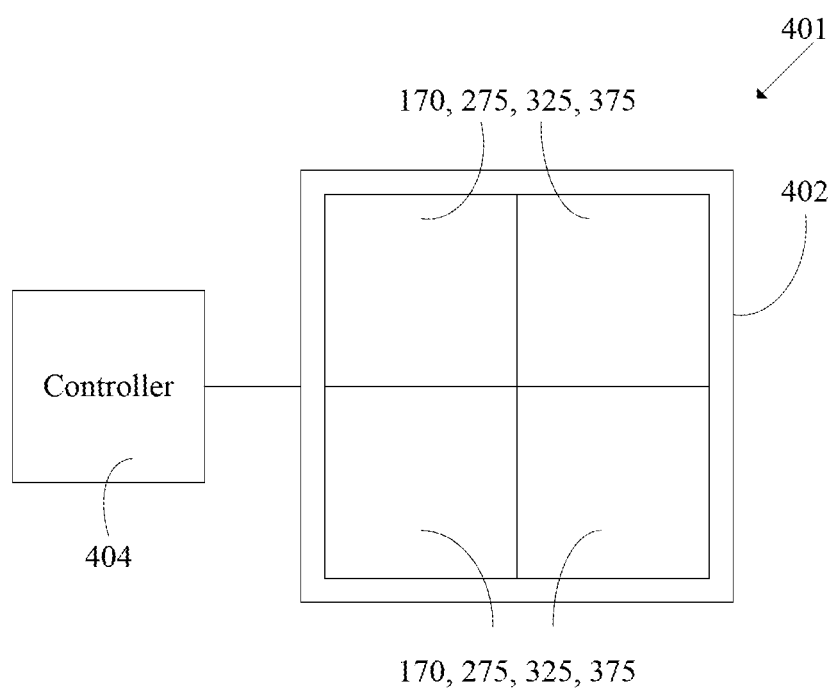
FIG. 13 is a schematic diagram of an electronic device, for example an image sensor.

FIG. 13 is a schematic diagram of an electronic device 401, for example an image sensor. The electronic device 401 includes a matrix 402 of pixels that may be any of the pixels 170, 275, 325, and 375 shown in FIGS. 3, 6, 8, and 12, respectively. Each pixel corresponds to the unit of an image produced by the image sensor. The device 401 also includes a control circuit 404 configured to supply the control signals VR, TG, VRS, and VRS*.

Various embodiments and variants have been described. Those skilled in the art will understand that certain features of these embodiments can be combined and other variants will readily occur to those skilled in the art. In particular, although all of the structures previously illustrated and described are structures configured for the case where the charges are holes, it is clear that the embodiments can adapt to the case where the electric charges are electrons. The P channel transistors are then replaced by N channel transistors and vice versa.

In such a case, the voltage V0 is lower than the voltage VSF. Additionally, the drain of the transistor 176 and the source of the transistor 174 are coupled, preferably connected, to the node N2. The source of the transistor 176 and the drain of the transistor 174 are then coupled to the node N3.

The simulations and graphs have been done for transistors having specific characteristics (dimensions, threshold voltage, etc.); however, the behavior of the embodiments remains the same for transistors having different characteristics.

Finally, the practical implementation of the embodiments and variants described herein is within the capabilities of those skilled in the art based on the functional description provided hereinabove.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A pixel, comprising:
a photodiode;
a first transistor coupled to the photodiode, the first transistor has a first channel type;
a second transistor coupled to the first transistor, the second transistor has a second channel type, the first and second transistors are coupled in series; and
a third transistor coupled to the second transistor, the third transistor has the first channel type, the first channel type and the second channel type are different, a drain terminal of the second transistor is coupled to a source terminal of the third transistor, a drain terminal of the third transistor is coupled to a source terminal of the second transistor, and a gate terminal of the second transistor has a different voltage than a gate terminal of the third transistor.

2. The pixel according to claim 1, wherein the second and third transistors configured to be on at the same times.

3. The pixel according to claim 1, further comprising a fourth transistor coupling the photodiode to a gate terminal of the first transistor.

4. The pixel according to claim 3, wherein the fourth transistor has the first channel type.

5. The pixel according to claim 3, further comprising a fifth transistor having a conduction channel extending between a terminal for applying a reference voltage and an intermediate node coupled to the fourth transistor and the gate terminal of the first transistor.

6. The pixel according to claim 5, wherein the fifth transistor has the first channel type.

7. The pixel according to claim 1, wherein the first transistor is coupled between a first node for applying a reference voltage and an intermediate node, and the second transistor is coupled between the first node and an output node of the pixel.

8. The pixel according to claim 1, further comprising isolated conductive trenches at least partially laterally enclosing the photodiode.

9. The pixel according to claim 8, wherein at least one of isolated conductive trenches extends along at least part of a height of the first and second transistors.

10. The pixel according to claim 1, comprising a first stage including the photodiode and a second stage including the first and second transistors, the first and second stages being attached to one another.

11. An electronic device, comprising:
at least one pixel that includes:

a photodiode;
a first transistor coupled to the photodiode, the first transistor has a first channel type; and
an assembly coupled to the first transistor, the first transistor and the assembly are coupled in series, the assembly includes:
a second transistor has a second channel type; and
a third transistor has the first channel type, the second transistor and the third transistor are coupled in parallel, the first channel type and the second channel type are different, a gate terminal of the second transistor is configured to receive a different voltage than a gate terminal of the third transistor, source and drain terminals of the second transistor are directly coupled to source and drain terminals of the third transistor.

12. The electronic device according to claim 11, wherein the at least one pixel includes a matrix of pixels configured to be controlled by a control circuit.

13. The electronic device according to claim 12, wherein the control circuit is configured to turn on the second and third transistors at the same times.

14. The electronic device according to claim 11, wherein the at least one pixel includes:
a fourth transistor coupling the photodiode to a gate terminal of the first transistor; and
a fifth transistor having a conduction channel extending between a terminal for applying a reference voltage and an intermediate node coupled to the fourth transistor and the gate terminal of the first transistor.

15. A method, comprising:
manufacturing a pixel, the manufacturing including:
forming a photodiode;
forming a first transistor coupled to the photodiode, the first transistor has a first channel type;
forming a second transistor coupled to the first transistor in series, the second transistor has a second channel type;
forming a third transistor coupled to the second transistor in parallel, the third transistor has the first channel type, the first channel type and the second channel type are different;
coupling a drain terminal of the second transistor to a source terminal of the third transistor;
coupling a drain terminal of the third transistor to a source terminal of the second transistor, wherein a gate terminal of the second transistor is configured to receive a different voltage than a gate terminal of the third transistor.

16. The method according to claim 15, wherein the pixel includes:
manufacturing a first stage that includes the photodiode;
coupling a second stage to the first stage; and
forming transistors in the second stage.

17. The method according to claim 15, comprising forming cavities extending over a height of the transistors and at least partially over a height of the photodiode, at least some of the cavities being partially filled with conductive material and partially filled with insulating material.

18. The method according to claim 17, wherein some of the cavities are completely filled with conductive material.

19. The pixel according to claim 6, further comprising a capacitor coupled to the intermediate node.

20. The pixel according to claim 1, wherein the first transistor is coupled to the second transistor at a first node; and
a drain/source terminal of the first transistor is coupled to the first node, the drain terminal of the second transistor is coupled to the first node, and the source terminal of the third transistor is coupled to the first node.

* * * * *